US012763728B2

(12) United States Patent
Ahn et al.

(10) Patent No.: US 12,763,728 B2
(45) Date of Patent: Oct. 13, 2026

(54) DATA DRIVING CIRCUIT AND DISPLAY INCLUDING THE SAME

(71) Applicant: LX SEMICON CO., LTD., Daejeon (KR)

(72) Inventors: Yong Sung Ahn, Daejeon (KR); Ji Won Kim, Daejeon (KR); Hyo Joong Kim, Daejeon (KR); Kyung Min Shin, Daejeon (KR); Kyu Tae Lee, Daejeon (KR); Ha Rim Choi, Daejeon (KR)

(73) Assignee: LX SEMICON CO., LTD., Daejeon (KR)

( * ) Notice: Subject to any disclaimer, the term of this patent is extended or adjusted under 35 U.S.C. 154(b) by 0 days.

(21) Appl. No.: 19/210,637

(22) Filed: May 16, 2025

(65) Prior Publication Data

US 2025/0279749 A1 Sep. 4, 2025

Related U.S. Application Data

(63) Continuation of application No. 18/486,715, filed on Oct. 13, 2023, now Pat. No. 12,334,872.

(30) Foreign Application Priority Data

Oct. 13, 2022 (KR) ........................ 10-2022-0131483

(51) Int. Cl.
*H03F 1/02* (2006.01)
*G09G 3/20* (2006.01)
(Continued)

(52) U.S. Cl.
CPC ............. *H03F 1/02* (2013.01); *G09G 3/2007* (2013.01); *G09G 3/3233* (2013.01); *G09G 3/3275* (2013.01); *H03F 3/45076* (2013.01); *H03F 3/68* (2013.01); *G09G 2300/0842* (2013.01); *G09G 2300/0861* (2013.01);
(Continued)

(58) Field of Classification Search
CPC .......... H03F 1/02; H03F 3/45076; H03F 3/68; H03F 2203/45044; H03F 2203/45214; H03F 2203/45296; G09G 3/2007; G09G 3/3233; G09G 3/3275; G09G 2300/0842; G09G 2300/0861; G09G 2310/0291; G09G 2320/0233; G09G 2320/0673
See application file for complete search history.

(56) References Cited

U.S. PATENT DOCUMENTS

2006/0098032 A1 5/2006 Nakahira
2006/0244521 A1 11/2006 Yoshida
(Continued)

FOREIGN PATENT DOCUMENTS

KR 10-0649884 B1 11/2006
KR 10-2009-0051792 A 5/2009
KR 10-2017-0008558 A 1/2017

OTHER PUBLICATIONS

Extended European Search Report issued for European Patent Application No. 23203329.0 dated Mar. 25, 2024, 17 pages.

*Primary Examiner* — Kenneth B Lee, Jr.
(74) *Attorney, Agent, or Firm* — ROTHWELL, FIGG, ERNST & MANBECK, P.C.

(57) ABSTRACT

The present disclosure relates to an offset elimination operation of an internal operational amplifier of a data driving circuit and relates to a technique that applies different offset elimination methods for each position of an operational amplifier.

20 Claims, 11 Drawing Sheets

(51) Int. Cl.
*G09G 3/3233* (2016.01)
*G09G 3/3275* (2016.01)
*H03F 3/45* (2006.01)
*H03F 3/68* (2006.01)

(52) U.S. Cl.
CPC ............... *G09G 2310/0291* (2013.01); *G09G 2320/0233* (2013.01); *G09G 2320/0673* (2013.01); *H03F 2203/45044* (2013.01); *H03F 2203/45214* (2013.01); *H03F 2203/45296* (2013.01)

(56) References Cited

U.S. PATENT DOCUMENTS

| | | | | |
|---|---|---|---|---|
| 2006/0290619 | A1* | 12/2006 | Lee | G09G 3/3275 345/77 |
| 2010/0265274 | A1 | 10/2010 | Han et al. | |
| 2015/0236648 | A1* | 8/2015 | Ahmad | H03F 3/45977 330/84 |
| 2017/0018249 | A1 | 1/2017 | Lim et al. | |
| 2017/0263185 | A1* | 9/2017 | Nakagawa | G09G 3/3275 |
| 2021/0408986 | A1 | 12/2021 | Hancioglu | |
| 2022/0328012 | A1* | 10/2022 | Lim | G09G 3/3291 |
| 2023/0119029 | A1* | 4/2023 | Oh | G09G 3/3233 345/204 |

* cited by examiner

DATA DRIVING CIRCUIT AND DISPLAY INCLUDING THE SAME

CROSS-REFERENCE TO RELATED APPLICATIONS

This application is a continuation of U.S. patent application Ser. No. 18/486,715, filed on Oct. 13, 2023, which claims priority from Korean Patent Application No. 10-2022-0131483, filed on Oct. 13, 2022, both disclosures of which are incorporated herein by reference in their entirety.

BACKGROUND

Technical Field

The present disclosure relates to a data driving circuit that drives pixels of a panel and a display device including the same.

Related Art

With the development of informatization, various display devices capable of visualizing information are being developed. A liquid crystal display (LCD), an organic light emitting diode (OLED) display device, and a plasma display panel (PDP) display device are display devices which have been developed so far or are being developed. Such display devices are being developed to appropriately display high-resolution images.

However, the above-described display devices have an advantage of high resolution, but have a disadvantage that the display devices are difficult to make larger in size. For example, large OLED display devices developed so far have only sizes of 80 inches (about 2 meters) and 100 inches (about 2.5 meters), so they are not suitable for making a large display device with a width of more than 10 meters.

Recently, there has been increasing interest in a light emitting diode (LED) display device as a method for solving such a problem in terms of large size. In an LED display device technique, as a required number of modularized LED pixels are disposed, one large panel may be configured. Alternatively, in the LED display device technique, as a required number of unit panels configured by a plurality of LED pixels are disposed, one large panel structure may be formed. As such, in the LED display device technique, a large display device may be easily realized by disposing LED pixels by increasing the number thereof as many as required.

The LED display device has advantages of not only a large size but also various panel sizes. In the LED display device technique, it is possible to variously adjust horizontal and vertical sizes according to appropriate disposition of LED pixels.

Meanwhile, the display device may optimize luminance of a pixel by adjusting the luminance of the pixel using a data voltage and providing a gamma reference voltage corresponding to a gamma curve in consideration of human visibility. A current flowing through the pixel may be adjusted by the data voltage and gamma reference voltage and the luminance may be determined according to strength of the current. A gamma voltage generation circuit that generates the gamma reference voltage divides a power supply voltage supplied from a power supply to generate the gamma reference voltage, but an offset voltage formed in an operational amplifier makes it difficult to achieve accurate grayscale.

SUMMARY

Technical Problem

Under such a background, in one aspect, the present disclosure is to provide a data driving circuit for achieving accurate luminance of pixels and a display device including the same.

In one aspect, the present disclosure is to provide a data driving circuit for achieving accurate grayscale and a display device including the same by performing offset elimination by mixing driving methods of eliminating offsets of an operational amplifier circuit connected to an end of a resistor string and an operational amplifier circuit connected to one node of a resistor string in a voltage distribution process for grayscale expression in a gamma voltage generation circuit.

Technical Solution

To this end, in one aspect, the present disclosure may provide a gamma voltage generation circuit comprising: a first operational amplifier circuit connected to an uppermost end of a resistor string and outputting a first voltage; a second operational amplifier circuit connected to a lowest end of the resistor string and outputting a second voltage; and a third operational amplifier circuit connected to a node between the resistor strings and dividing and outputting the first voltage and the second voltage, wherein the third operational amplifier circuit is selectively driven at different time intervals and includes a first offset elimination circuit that eliminates an offset voltage of an internal operational amplifier of the third operational amplifier circuit.

To this end, in another aspect, the present disclosure may provide a data driving circuit comprising: a data voltage generation circuit that supplies a data voltage to a pixel through a data line; and a gamma reference voltage generation circuit that distributes a power supply voltage formed at both ends of a resistor string to generate a gamma reference voltage and supplies it to the pixel through the data line, wherein the gamma reference voltage generation circuit includes: a first operational amplifier circuit connected to a first end of the resistor string; a second operational amplifier circuit connected to a second end of the resistor string; and a third operational amplifier circuit connected to a node of the resistor string, wherein the first operational amplifier circuit and the second operational amplifier circuit eliminate an offset voltage of an internal operational amplifier in a manner different from that of the third operational amplifier circuit, and the first operational amplifier circuit and the second operational amplifier circuit eliminate the offset voltage by operation of a pair of switches that alternately change connection of input and output terminals.

To this end, in still another aspect, the present disclosure provides may provide a method of eliminating an offset comprising: eliminating an offset voltage of a first operational amplifier circuit connected to one end of a resistor string and outputting a first gamma reference voltage; eliminating an offset voltage of a second operational amplifier circuit connected to the other end of the resistor string and outputting a second gamma reference voltage; and eliminating an offset voltage of a third operational amplifier circuit connected to a node of the resistor string and outputting a third gamma reference voltage, wherein the third operational amplifier circuit includes a first offset elimination circuit connected in parallel, and the first or second operational amplifier circuit includes a third offset elimination circuit that independently performs an offset elimination operation different from that of the first offset elimination circuit.

Advantageous Effects

As described above, according to embodiments of the present disclosure, it is possible to implement more accurate luminance by effectively eliminating an offset voltage present in an operational amplifier circuit in a process of implementing a grayscale in a data driving circuit and a display device including the same.

DETAILED DESCRIPTION

Figure 1:
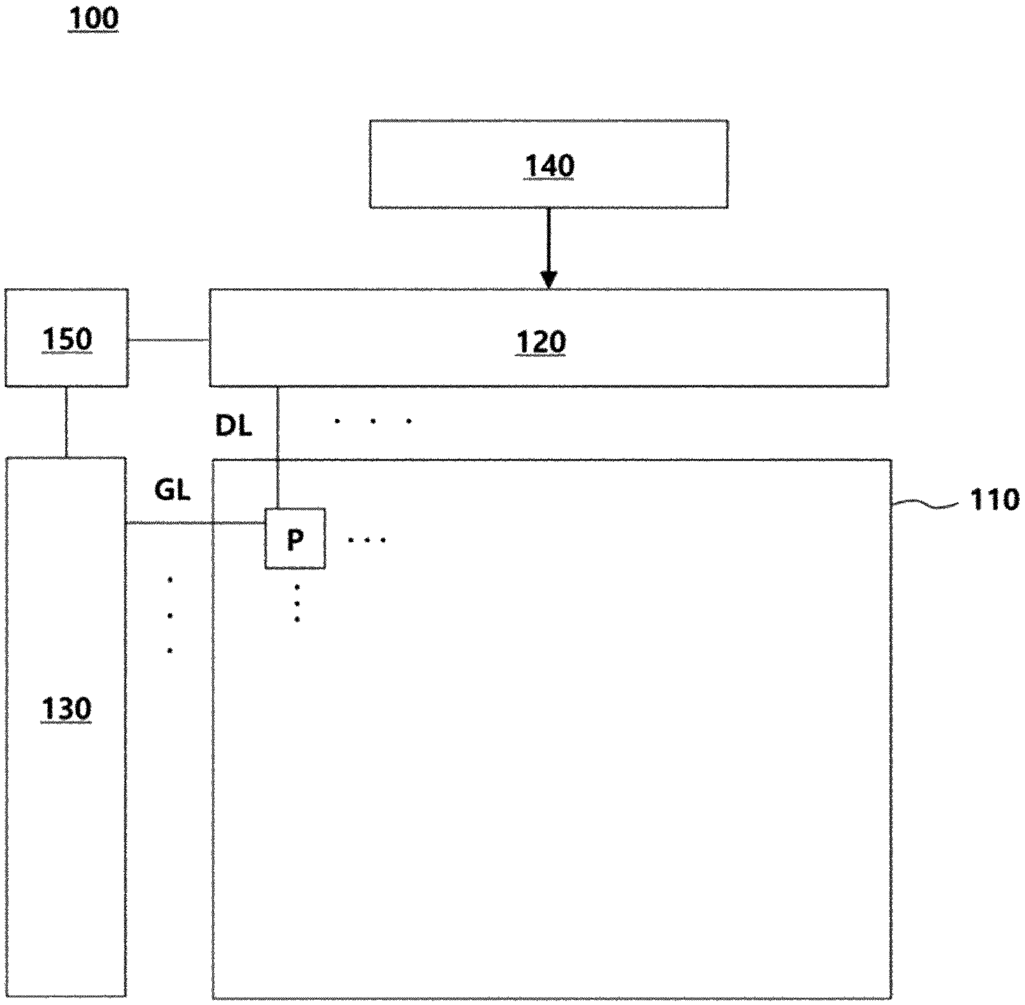
FIG. 1 is a configuration diagram of a display device according to an embodiment of the present disclosure.

FIG. 1 is a configuration diagram of a display device according to an embodiment of the present disclosure.

As shown in FIG. 1, a display device 100 according to an embodiment of the present disclosure of the present disclosure performs a display function and a touch sensing function and may be implemented as a flat panel display such as a liquid crystal display (LCD) or an organic light emitting diode display (OLED).

Referring to FIG. 1, the display device 100 may include a panel 110, a data driving circuit 120, a gate driving circuit 130, a touch sensing circuit 140, and a timing controller 150, etc.

A plurality of data lines DL connected to the data driving circuit 120 may be formed in the panel 110 and a plurality of gate lines GL connected to the gate driving circuit 130 may be formed. In addition, a plurality of pixels P corresponding to intersection points of the plurality of data lines DL and the plurality of gate lines GL may be defined in the panel 110. A pixel P may be defined by a pixel circuit inside the panel 110.

At least two light emitting diodes (LEDs) may be disposed in each pixel P. Both LEDs may be used, or one of the two LEDs may be selectively used using selection signals as described later. In addition, each pixel P may express a grayscale value according to the total amount of power or current supplied to the LEDs.

A plurality of transistors and at least one capacitor may be disposed in each pixel P. For example, eleven transistors and two capacitors may be disposed in each pixel P. The total amount of power or current supplied to the LEDs may be determined by the operation of these transistors and capacitors. An example of a circuit structure of each pixel P will be described later.

The panel 110 may include a display panel and a touch screen panel (TSP), wherein the display panel and the touch panel may share some components with each other. For example, a plurality of touch electrodes (TE) may be a configuration of the display panel (e.g., a common electrode for applying a common voltage) and may be a configuration of the touch panel (a touch electrode for detecting a touch). In addition, the panel 110 may be an in-cell type panel in which some components of the display panel and the touch panel are shared with each other, but the embodiment is not limited thereto.

The data driving circuit 120 may receive a data control signal of the timing controller 150 and supply a data signal to the data line DL to display an image in each pixel P of the panel 110.

The data driving circuit 120 may supply a data voltage VDT to the pixel P to which a scan signal SCN is supplied. The data driving circuit 120 may receive image data RGB and a data control signal DCS from the timing controller 150 and may check a grayscale value of each pixel P according to the image data RGB. In addition, the data driving circuit 120 may generate the data voltage VDT according to the grayscale value of each pixel P and supply the data voltage VDT to the corresponding pixel P.

The data driving circuit 120 may drive the pixel P in a hybrid method that combines a PAM method and a PWM method. The data driving circuit 120 may determine an initial voltage of the data voltage VDT according to the grayscale value of each pixel P and supply the initial voltage to the pixel P, like the PAM method. In addition, like the PWM method, the pixel P may express a grayscale value according to an on-time of the LED in one control time, wherein the on-time of the LED may be determined by the initial voltage of the data voltage VDT.

For such a pixel driving method, at least one control signal CTR may be supplied to each pixel P, and such a control signal CTR may be supplied by the data driving circuit 120 or the gate driving circuit 130. In addition, some of the transistors disposed in each pixel P may be turned on or off by the control signal CTR.

The gate driving circuit 130 receives a gate control signal of the timing controller 150 and sequentially supplies a scan signal to the gate line GL to turn on or off the transistor located in each pixel P.

The gate driving circuit 130 and the data driving circuit 120 may form one integrated circuit. In addition, each may form a separate integrated circuit.

A gamma voltage generation circuit 140 may provide a gamma reference voltage to the pixel P and modulate input video data to control luminance. The gamma voltage generation circuit 140 may be a separate circuit from the data driving circuit 120, but may be implemented as an internal function of the data driving circuit 120 if necessary.

The timing controller 150 may supply various control signals to the data driving circuit 120, the gate driving circuit 130, and the touch circuit 140. The touch/display control circuit 150 may transmit a data control signal DCS that controls the data driving circuit 120 to supply a data voltage to each pixel P according to each timing, or may transmit a gate control signal GCS to the gate driving circuit 130, or may transmit a sensing signal to the touch sensing signal 140. The timing controller 150 may also perform other control functions.

One or more among the pixel circuit P, the data driving circuit 120, the gate driving circuit 130, and the timing controller 150 may form an integrated circuit to integrate and implement functions of each circuit.

Figure 2:
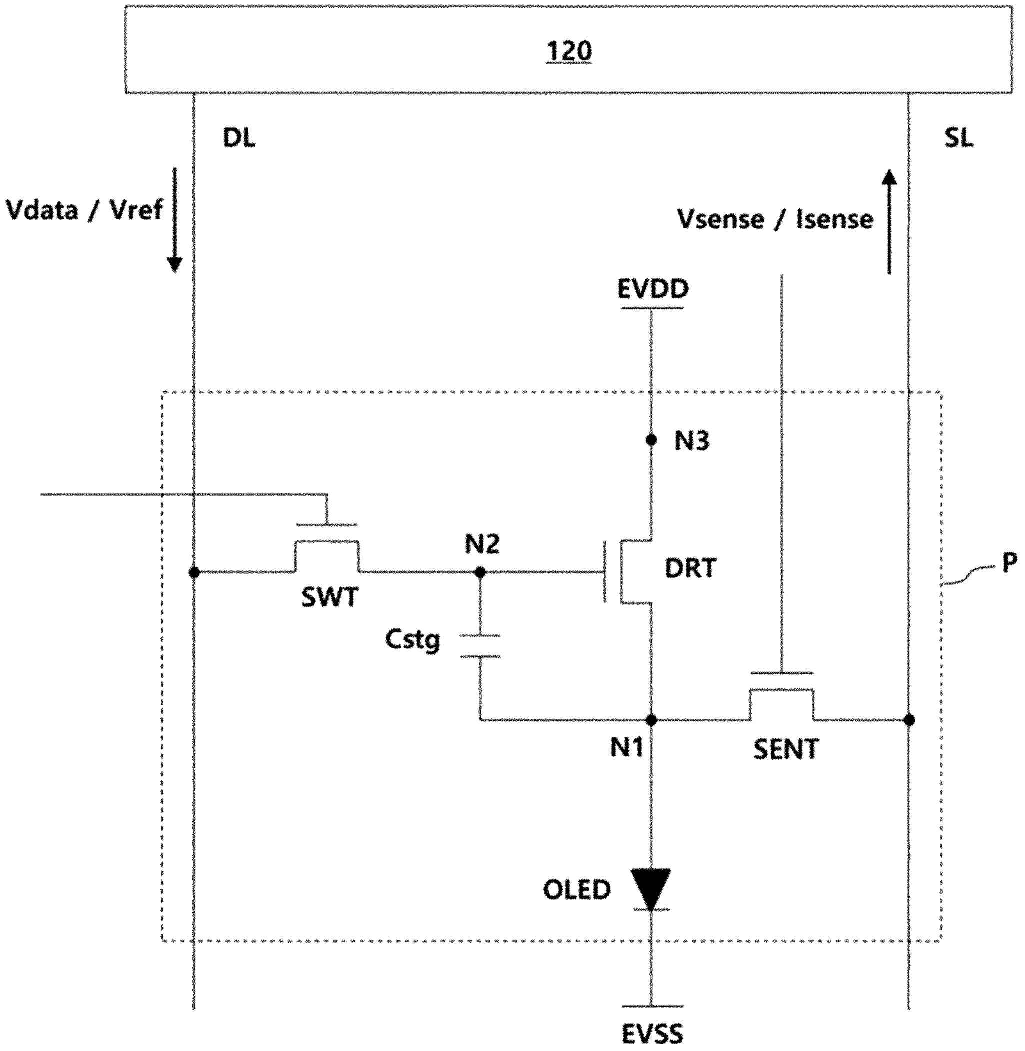
FIG. 2 is an exemplary configuration diagram of a pixel according to an embodiment of the present disclosure.

FIG. 2 is an exemplary configuration diagram of a pixel according to an embodiment of the present disclosure.

Referring to FIG. 2, pixels P disposed on a display panel 110 may include an organic light-emitting diode OLED, a driving transistor DRT, a switching transistor SWT, a sensing transistor SENT, and a storage capacitor Cstg.

The data driving circuit 120 may transmit a driving voltage Vd to each pixel P through the data line DL, and the data driving circuit 120 may receive an analog signal formed in each pixel P to determine characteristics of the pixel P. The timing controller 150 may analyze pixel sensing data to determine the characteristics of each pixel P and control a driving signal.

Under the control of the driving transistor DRT, an anode is connected to a driving voltage EVDD and a cathode is connected to a base voltage EVSS to emit light. The driving transistor DRT may control the luminance of the organic light emitting diode OLED by controlling a driving current supplied to the organic light emitting diode OLED.

According to an embodiment of the present disclosure, in order to compensate for a mura characteristic, the luminance of the organic light emitting diode OLED may be changed by controlling the driving current through the driving transistor DRT.

The sensing transistor SENT may connect a first node N1 of the driving transistor DRT and the sensing line SL, and the sensing line SL may transmit a reference voltage Vref to the first node N1 and transmit an analog signal, for example, voltage or current, formed at the node N1 to a pixel sensing circuit 130.

The data driving circuit 120 measures the characteristics of the pixel P using an analog signal (Vsense or Isense) transmitted through the sensing line SL. The pixel sensing circuit 130 may measure a current transmitted from or to the first node N1 and transmit pixel sensing data, which is a digital signal for the measured value, to the timing controller 150.

The characteristics of the organic light emitting diode OLED and transistor included in each pixel P may change depending on a time or a surrounding environment. Luminance deviation and color deviation of the display panel 110 may occur due to process errors, changes in characteristics of the pixel P over time, external factors, etc.

In order to implement accurate grayscale, a gamma reference voltage in addition to the data voltage may be supplied to the pixel P.

Figure 3:
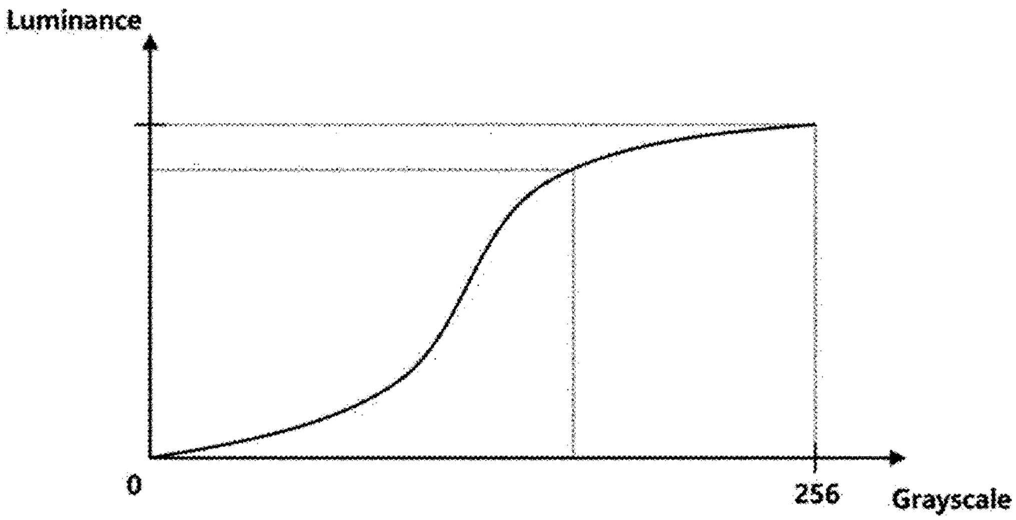
FIG. 3 is a diagram illustrating a gamma curve for implementing a grayscale of a pixel.

FIG. 3 is a diagram illustrating a gamma curve for implementing a grayscale of a pixel.

Referring to FIG. 3, the gamma curve may be defined as the correlation between luminance corresponding to the grayscale. Input video data may be modulated by adjusting the gamma curve, and the current flowing in the pixel may be determined based on a difference between the data voltage and the gamma reference voltage to implement the luminance of the pixel.

Figure 4:
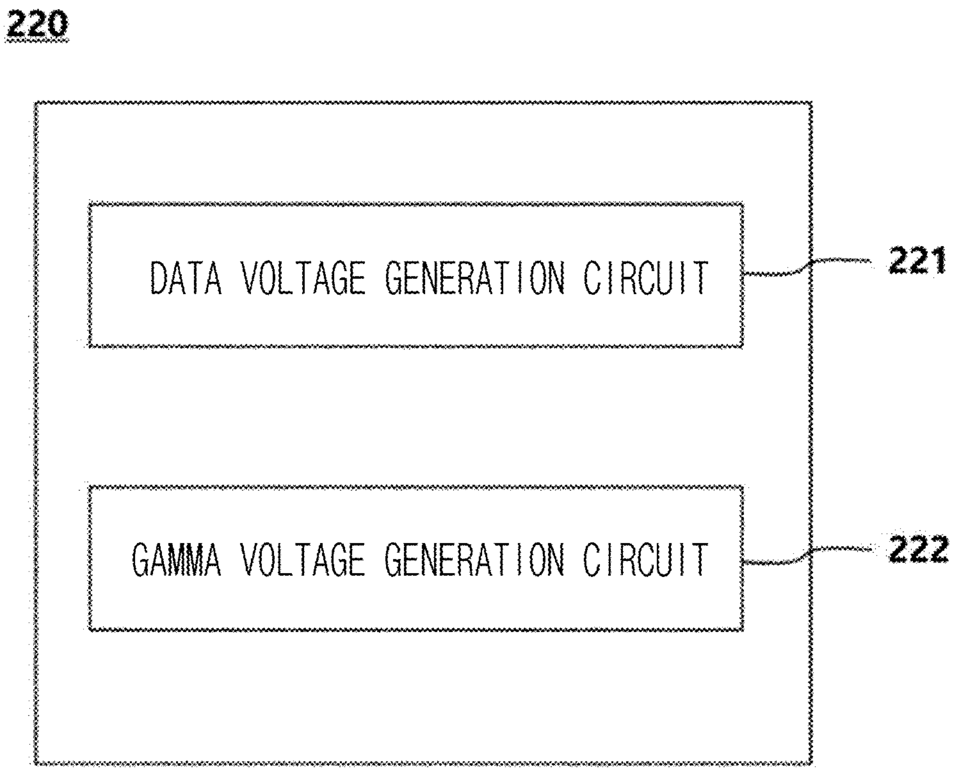
FIG. 4 is an exemplary configuration diagram of a data driving circuit according to an embodiment of the present disclosure.

FIG. 4 is an exemplary configuration diagram of a data driving circuit according to an embodiment of the present disclosure.

Referring to FIG. 4, the data driving circuit 220 may include a data voltage generation circuit 221, a gamma voltage generation circuit 222, and the like. The gamma voltage generation circuit 222 may be a separate circuit from the data driving circuit 220, but may implement an internal function of the data driving circuit 220.

The data voltage generation circuit 221 may convert RGB image data received from the timing controller into an analog signal, generate a data voltage, and transmit the data voltage to a pixel through a data line to realize the luminance of the pixel.

The gamma voltage generation circuit 222 may generate a gamma reference voltage transmitted to the pixel to transmit it to the pixel. Circuits disposed in the pixel may control luminance by a current defined by the data voltage and the gamma reference voltage.

The gamma voltage generation circuit 222 may generate a gamma reference voltage by distributing a power supply voltage formed at both ends of a resistor string and reduce a size of a signal wiring and circuit by sharing the data line that is a path through which the data voltage is supplied.

The gamma voltage generation circuit 222 may use an auto-zeroing method in which two offset elimination circuits are connected in parallel to eliminate an offset and each alternately repeats offset elimination and a chopping method in which a pair of chopping switches repeatedly turns on and off to repeat the offset elimination.

The gamma voltage generation circuit 222 may include a first operational amplifier circuit connected to a first end of the resistor string, a second operational amplifier circuit connected to a second end of the resistor string, and a third operation amplifier circuit connected to one node excluding an end of the resistor string, and the like.

The gamma voltage generation circuit 222 may perform offset voltage elimination in the same manner for the first operational amplifier circuit, the second operational amplifier circuit, and the third operational amplifier circuit, but perform the offset voltage elimination in different manners for the first operational amplifier circuit connected to the end of the resistor string, the second operational amplifier circuit, and the third operational amplifier circuit that divides an voltage applied to both ends of the resistor string to output the divided voltage.

In particular, since current may flow directly through signal lines connected to output terminals of the first operational amplifier circuit and the second operational amplifier circuit connected to both ends of the resistor string, there is a limit to applying an offset elimination method through which current flows.

In order to improve such a method, an absolute offset elimination operation of the auto-zeroing method in which current flows in a center of the resistor string is performed in the gamma voltage generation circuit 222, and an average offset elimination operation of the chopping method is performed in an uppermost operational amplifier circuit and a lowermost operational amplifier circuit, thereby effectively suppressing a current change using a mixed driving method.

Figure 5:
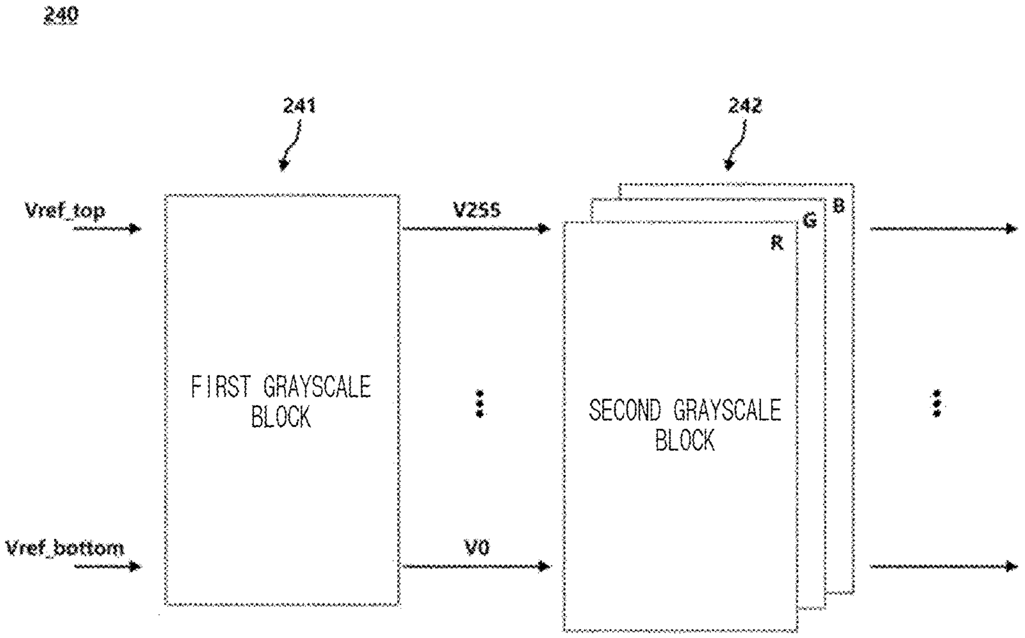
FIG. 5 is a first exemplary configuration diagram of a gamma voltage generation circuit according to an embodiment of the present disclosure.

FIG. 5 is a first exemplary configuration diagram of a gamma voltage generation circuit according to an embodiment of the present disclosure.

Referring to FIG. 5, a gamma voltage generation circuit 240 may distribute a maximum reference voltage Vref_top and a minimum reference voltage Vref_bottom supplied from the power supply to transmit output voltages V0 to V255 generated by a first grayscale block 241 to a second grayscale block 242.

The second grayscale block 242 may be a block for controlling the luminance of each RGB and may re-divide all or part of the output voltages V0 to V255 generated by the first grayscale block 241 to output them.

The second grayscale block 242 may form a separate chip from the first grayscale block 241 and may include the same configuration as all or part of circuit configurations of the first grayscale block 241.

Figure 6:
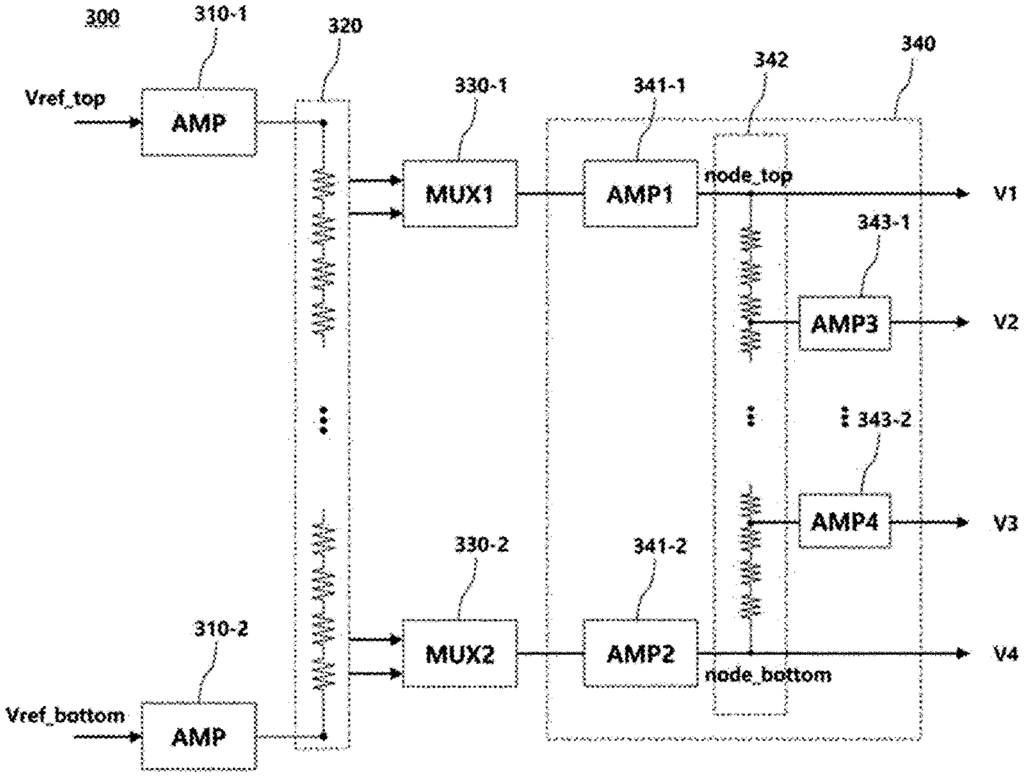
FIG. 6 is a second exemplary configuration diagram of a gamma voltage generation circuit according to an embodiment of the present disclosure.

FIG. 6 is a second exemplary configuration diagram of a gamma voltage generation circuit according to an embodiment of the present disclosure.

Referring to FIG. 6, a gamma voltage generation circuit 300 may include operational amplifier circuits 310-1 and 310-2 connected to both ends of a resistor string, a resistor string 320, multiplexers 330-1 and 330-2 that select one or more of nodes of the resistor string to output an output, a first grayscale block 340, and the like.

The gamma voltage generation circuit 300 may receive a maximum reference voltage Vref_top through the operational amplifier circuit 310-1 and receive a minimum reference voltage Vref_bottom through the operational amplifier circuit 310-2. Output terminals of the operational amplifier circuits 310-1 and 310-2 may be connected to the resistor string 320 to form a voltage at both ends of the resistor string 320.

The first multiplexer 330-1 and the second multiplexer 330-2 may select a signal transmitted from one of preset signal lines of the resistor string 320 to transmit the signal to the first grayscale block 340.

The power supply voltage may be divided according to a position of the signal line selected by the first multiplexer 330-1 and the second multiplexer 330-2 to output the divided voltage to a first operational amplifier circuit 341-1 and a second operational amplifier circuit 341-2. The voltage output to the first operational amplifier circuit 341-1 and the second operational amplifier circuit 341-2 may be a voltage between the maximum reference voltage Vref_top and the minimum reference voltage Vref_bottom.

In the first operational amplifier circuit 341-1, an input terminal is connected to the first multiplexer 330-1 supplied with a voltage, and an output signal V1 supplied from an output terminal, for example, a top node (node_top), may not be divided.

In the second operational amplifier circuit 341-2, an input terminal is connected to the second multiplexer 330-2 supplied with a voltage, and an output signal V4 supplied from an output terminal, for example, a bottom node (node_bottom), may not be divided.

If necessary, the operational amplifier circuits 310-1 and 310-2, the resistor string 320, and the multiplexers 330-1 and 330-2 may be omitted, but may be included for effective grayscale implementation.

The first operational amplifier circuit 341-1 may be connected to an uppermost end of a resistor string 342 and may output a first voltage. The first operational amplifier circuit 341-1 may be connected to the resistor string 342 to form the top node and may supply a highest voltage of the resistor string 342.

The second operational amplifier circuit 341-1 may be connected to a lowest end of the resistor string and may output a second voltage. The second operational amplifier circuit 341-2 may be connected to the resistor string 342 to form the bottom node and may supply a lowest voltage of the resistor string 342.

A third operational amplifier circuit 343-1 or a fourth operational amplifier circuit 343-2 may be connected to a node between the resistor strings and divide the first and second voltages to output a third voltage V3 or a fourth voltage V4.

The first to fourth operational amplifier circuits 341-1, 341-2, 343-1, and 343-2 may include an offset voltage, and a voltage difference between two input terminals of the amplifier circuit may be formed. The reason why the offset voltage is formed may be caused by non-uniformity in circuit configuration such as transistors inside integrated circuits, temperature changes, etc.

The operational amplifier circuits 310-1, 310-2, 341-1, 341-2, 343-1, and 343-2 inside the gamma voltage generation circuit 300 may perform an offset operation for eliminating the offset voltage.

However, in the uppermost operational amplifier circuit and the lowermost operational amplifier circuit where an output current path is formed and connected to other circuits to allow current to flow, there is a limitation that the offset voltage may not be eliminated through the auto-zeroing method among various methods for eliminating offset.

Accordingly, by performing a mixed drive that implements different offset elimination methods for a center operational amplifier circuit formed by the uppermost and lowermost operational amplifier circuits and the resistor string, the absolute offset elimination and average offset elimination are simultaneously implemented, thereby more precisely controlling the pixel grayscale.

Figure 7:
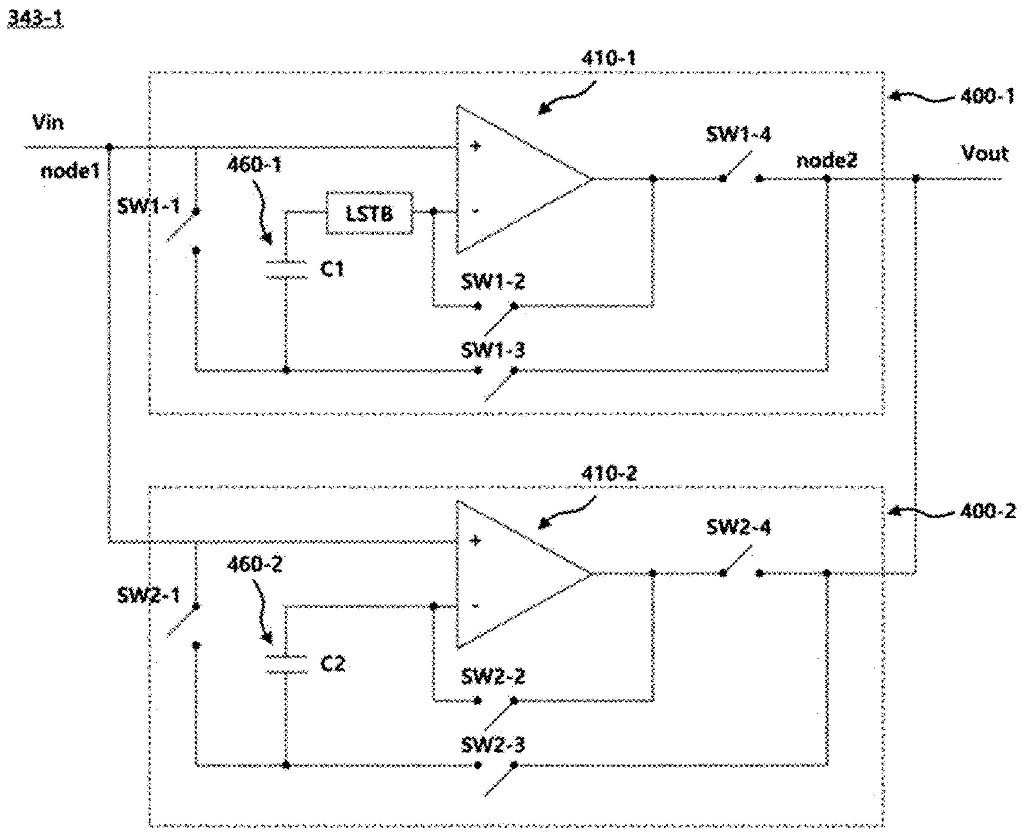
FIG. 7 is an exemplary configuration diagram of a first offset elimination circuit and a second offset elimination circuit according to an embodiment of the present disclosure.

FIG. 7 is an exemplary configuration diagram of a first offset elimination circuit and a second offset elimination circuit according to an embodiment of the present disclosure.

Referring to FIG. 7, the third operational amplifier circuit 343-1 may be selectively driven in different time intervals and include a first offset elimination circuit 400-1 and a second offset elimination circuit 400-2 that eliminate an offset voltage of an internal operational amplifier of the third operational amplifier circuit 343-1.

The first offset elimination circuit 400-1 and the second offset elimination circuit 400-2 are alternately driven as a pair, so that an output signal may be stably transmitted while performing an offset elimination operation. The first offset elimination circuit 400-1 and the second offset elimination circuit 400-2 have the same structure, and turn-on and turn-off timings of internal switches of the first offset elimination circuit 400-1 and the second offset elimination circuit 400-2 may be controlled to be opposite to each other.

For example, it is possible to repeat that the second offset elimination circuit 400-2 performs an offset elimination operation at a sampling operation timing of the first offset elimination circuit 400-1 and the first offset elimination circuit 400-1 performs the offset elimination operation at a sampling operation timing of the second offset elimination circuit 400-2.

In the first offset elimination circuit 400-1 and the second offset elimination circuit 400-2, a signal line through which an input signal Vin is transmitted may form a common node (node1), and a signal line through which an output signal Vout is transmitted may form a common node (node2) to be connected in parallel.

The offset elimination operation of the first offset elimination circuit 400-1 and the offset elimination operation of the second offset elimination circuit 400-2 may be performed alternately and continuously, and in this manner, the voltage Vout of an output terminal may be stably supplied.

The first offset elimination circuit 400-1 may perform a sampling operation in a first time interval to charge an offset voltage of a first sub-operational amplifier circuit 410-1 to a first capacitor 460-1 and perform an offset elimination operation in a second time interval to eliminate the offset voltage of the first sub-operational amplifier circuit 410-1 based on a voltage stored in the first capacitor 460-1.

The second offset elimination circuit 400-2 may perform an offset elimination operation in the first time interval to eliminate an offset voltage of a second sub-operational amplifier circuit 410-2 based on a voltage stored in a second capacitor 460-2 and perform a sampling operation in the second time interval to charge the offset voltage of the second sub-operational amplifier circuit 410-2 to the second capacitor 460-2. The operation time intervals of the first offset elimination circuit 400-1 and the second offset elimination circuit 400-2 of the third operational amplifier circuit 343-1 are defined differently, and the fluctuation of the output signal Vout that may occur due to the offset voltage may be reduced by adjusting the turn-on and turn-off timings of each switch to correspond thereto.

For example, switches SW2-1, SW2-2, SW2-3, and SW2-4 may be turned off at a turn-on timing of switches SW1-1, SW1-2, SW1-3, and SW1-4, the switches SW2-1, SW2-2, SW2-3, and SW2-4 may be turned on at a turn-off timing of the switches SW1-1, SW1-2, SW1-3, and SW1-4.

The first operational amplifier circuit 341-1 and the second operational amplifier circuit 341-2 of the gamma voltage generation circuit 300 may further include a third offset elimination circuit that performs an offset voltage elimination operation independently of offset voltage elimination operations of the first offset elimination circuit and the second offset elimination circuit.

Although the offset elimination method for the third operational amplifier circuit 343-1 is described in FIG. 7, the same offset elimination method may be applied to the fourth operational amplifier circuit 343-2 or the like.

Figure 8:
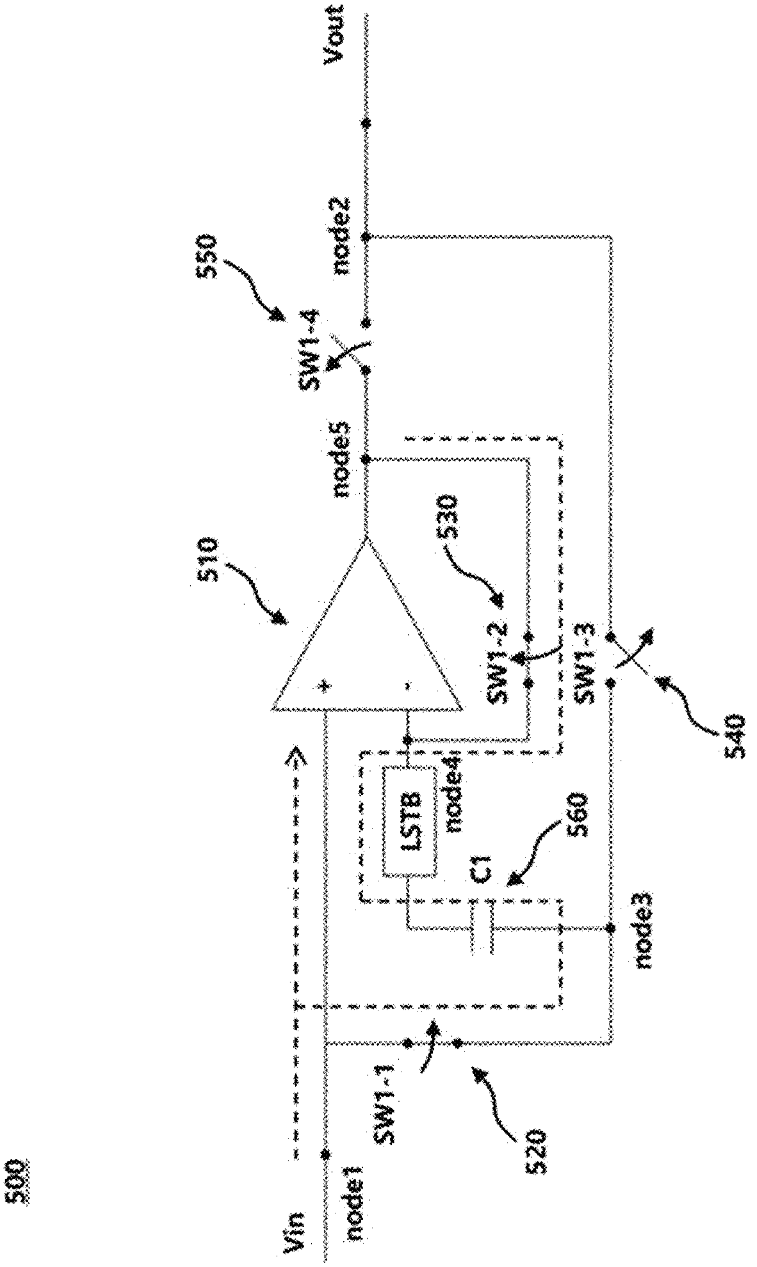
FIG. 8 is a diagram illustrating a sampling operation of a first offset elimination circuit according to an embodiment of the present disclosure.

FIG. 8 is a diagram illustrating a sampling operation of a first offset elimination circuit according to an embodiment of the present disclosure.

Figure 9:
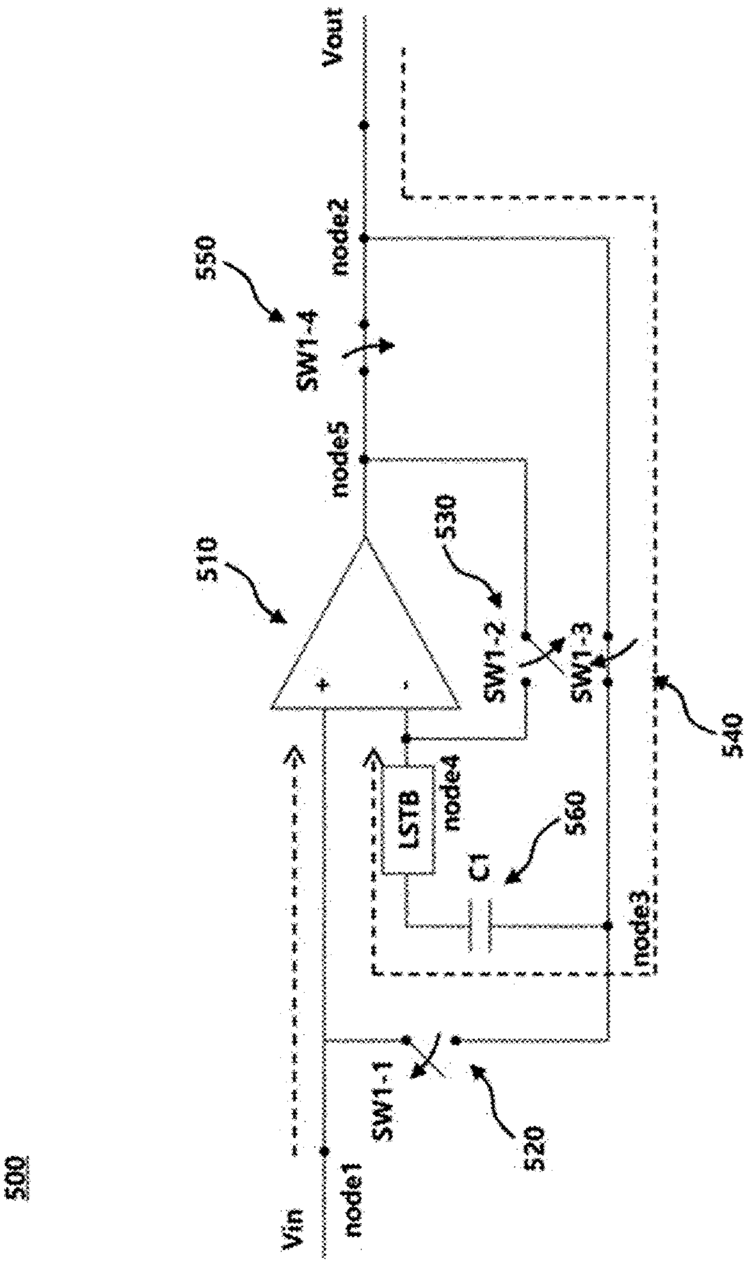
FIG. 9 is a diagram illustrating an elimination operation of an offset voltage of the first offset elimination circuit according to an embodiment of the present disclosure.

FIG. 9 is a diagram illustrating an offset voltage elimination operation of the first offset elimination circuit according to an embodiment of the present disclosure.

Referring to FIGS. 8 and 9, a first offset elimination circuit 500 may include a first sub-operational amplifier 510, a first switch 520, a second switch 530, a third switch 540, a fourth switch 550, a first capacitor 560, and the like.

The first sub-operational amplifier 510 may process an input signal Vin and transmit an output signal Vout, but voltage imbalance may temporarily occur between input terminals due to an offset voltage formed therein.

The first switch 520 may be electrically connected to a first input terminal of the first sub-operational amplifier 510, for example, a plus terminal and may form a first node (node1) as a common node with the first input terminal of the first sub-operational amplifier 510.

The first capacitor 560 may be electrically connected to a second input terminal of the first sub-operational amplifier 510, for example, a minus terminal and may charge and store an offset voltage of the first sub-operational amplifier 510. A transistor LSTB may or may not be disposed between the second input terminal of the first sub-operational amplifier 5100 and the capacitor 560.

One terminal of the first capacitor 560 may form a third node (node3) as a common node with the first switch 520.

The second switch 530 may be electrically connected to a second input terminal and an output terminal of the first sub-operational amplifier 510. The second switch 530 may form a fourth node as a common node with the first capacitor 560.

The third switch 540 may be electrically connected to the first switch 520 and the first capacitor 560 and may form a third node as a common node with the first switch 520 and the first capacitor 560.

The fourth switch 550 may be electrically connected to an output terminal of the first sub-operational amplifier 510 and may form a fifth node as a common node with the second switch 530 and the output terminal of the first sub-operational amplifier 510.

The fourth switch 550 may be connected to an output terminal that transmits the output signal Vout of the first offset elimination circuit 500 and may form a second node as a common node with the third switch 540.

In the first offset elimination circuit 500, the first switch 520 and the second switch 530 are turned on and the third switch 540 and the fourth switch 550 are turned off in the first time interval to store an offset voltage of the first sub-operational amplifier 510 in the first capacitor 560.

In the first offset elimination circuit 500, the first switch 520 and the second switch 530 are turned off and the third switch 540 and the fourth switch 550 are turned on in the second time interval to eliminate the offset voltage of the first sub-operational amplifier 510.

The second offset elimination circuit may have the same circuit structure as the first offset elimination circuit and may be connected in parallel with the first offset elimination circuit, and an operation of an internal switch corresponding to the first offset elimination circuit may alternate.

FIG. 9 is for illustrating the offset voltage elimination operation of the first offset elimination circuit 500 and may have various modified embodiments that are not limited thereto.

The sub-operational amplifier defined in FIG. 9 may be a general operational amplifier circuit and may function as a part of configurations of the offset elimination circuit.

Figure 10:
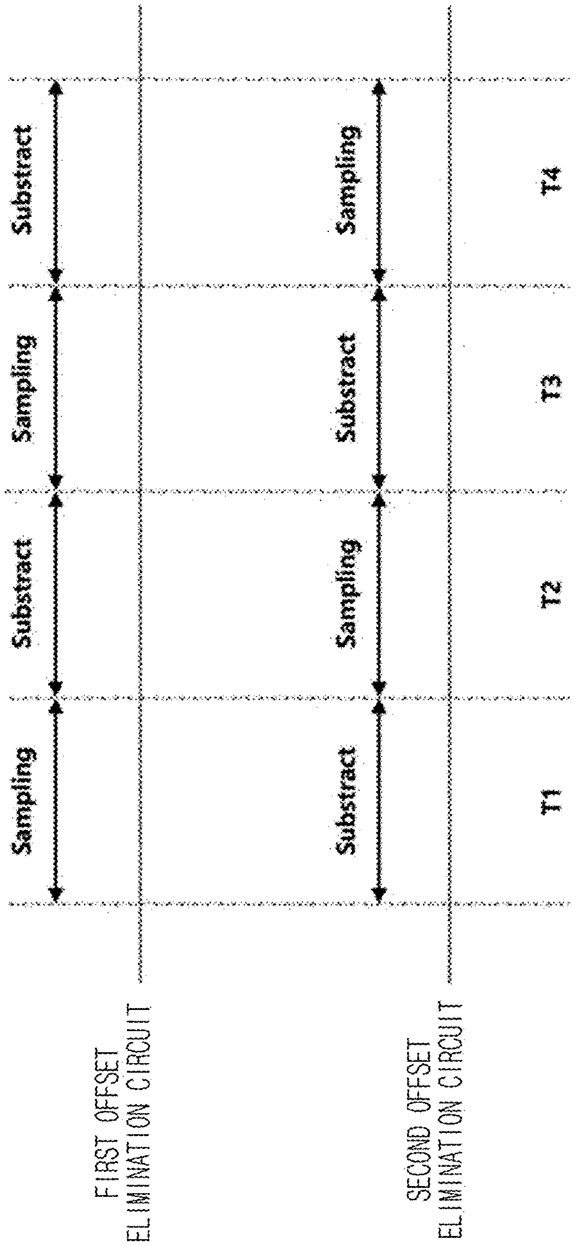
FIG. 10 is a diagram illustrating operation timings of the first offset elimination circuit and a second offset elimination circuit according to an embodiment of the present disclosure.

FIG. 10 is a diagram illustrating operation timings of the first offset elimination circuit and the second offset elimination circuit according to an embodiment of the present disclosure.

Referring to FIG. 10, a sampling operation time interval and an offset voltage elimination operation time interval of the first offset elimination circuit and the second offset elimination circuit may be performed repeatedly, and operations of the first offset elimination circuit and the second offset elimination circuit may be opposite to each other.

For example, in first and third time intervals T1 and T3, the first offset elimination circuit may perform a sampling operation, and the second offset elimination circuit may perform an offset voltage elimination operation.

For example, in second and fourth time intervals T2 and T4, the first offset elimination circuit may perform a sampling operation, and the second offset elimination circuit may perform an offset voltage elimination operation.

By differently dividing the offset elimination operation of the first offset elimination circuit and the offset elimination operation of the second offset elimination circuit and setting them alternately, it is possible to perform the offset voltage elimination operation and stably output an output signal at the same time.

In a method of eliminating an offset according to an embodiment of the present disclosure, eliminating an offset voltage of a first operational amplifier circuit connected to one end of a resistor string and outputting a first gamma reference voltage, eliminating an offset voltage of a second operational amplifier circuit connected to the other end of the resistor string and outputting a second gamma reference voltage, and eliminating an offset voltage of a third operational amplifier circuit connected to a node of the resistor string and outputting a third gamma reference voltage may be performed independently or simultaneously.

The third operational amplifier circuit may include a first offset elimination circuit and a second offset elimination circuit having the same circuit structure and connected in parallel to perform an offset elimination operation of the auto-zeroing method.

For example, the first offset elimination circuit may perform the sampling operation in the first time interval to charge the offset voltage of the first sub-operational amplifier circuit to the first capacitor and perform the offset elimination operation in the second time interval to eliminate the offset voltage of the first sub-operational amplifier circuit based on the voltage stored in the first capacitor.

For example, the second offset elimination circuit may perform the offset elimination operation in the first time interval to eliminate the offset voltage of the second sub-operational amplifier circuit based on the voltage stored in the second capacitor and perform the sampling operation in the second time interval to charge the offset voltage of the second sub-operational amplifier circuit to the second capacitor.

The first or second operational amplifier circuit may include a third offset elimination circuit that independently performs a chopping offset elimination operation. The third offset elimination circuit may perform an offset elimination operation by using first to fourth chopping switch circuits that are alternately turned on and off.

Figure 11:
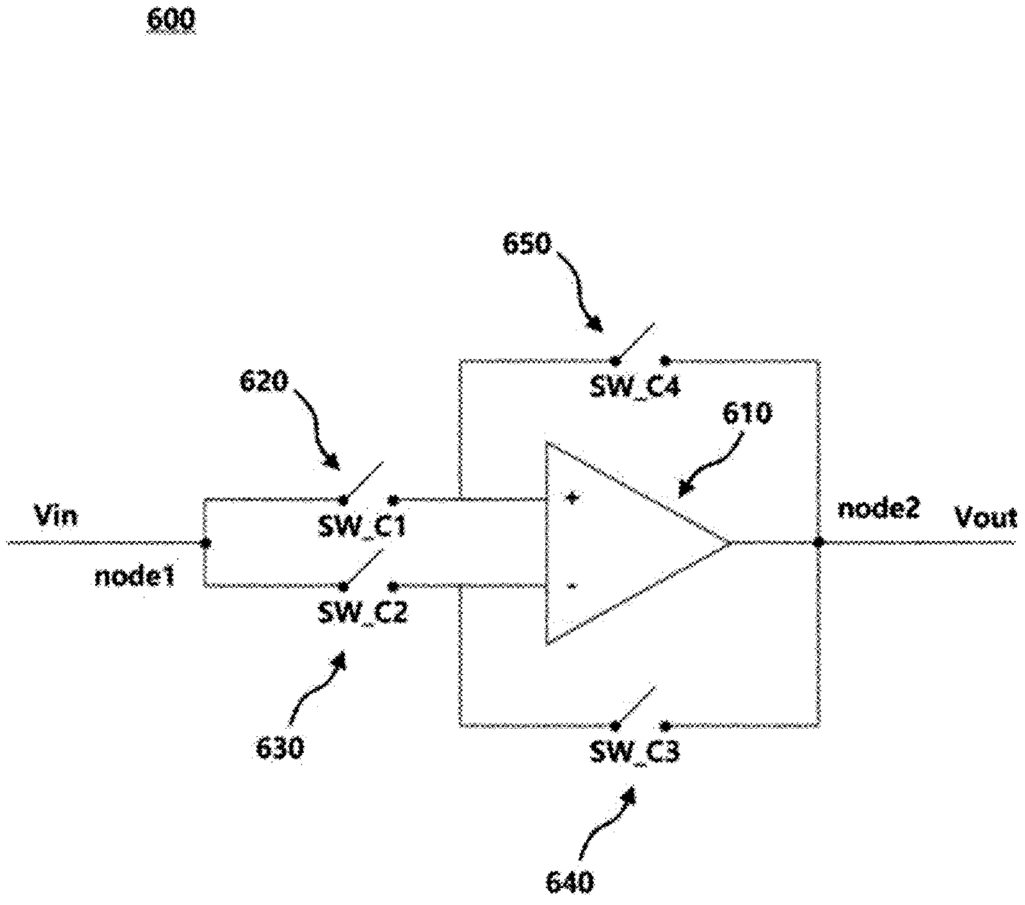
FIG. 11 is an exemplary configuration diagram of a third offset elimination circuit according to an embodiment of the present disclosure.

FIG. 11 is an exemplary configuration diagram of a third offset elimination circuit according to an embodiment of the present disclosure.

Referring to FIG. 11, a third offset elimination circuit 600 may include a third sub-operational amplifier 610, first to fourth chopping switch circuits 620, 630, 640, and 650, and the like.

The first to fourth chopping switch circuits 620, 630, 640, and 650 may be turned on and off alternately and may adjust an on/off status and on/off timing of a specific group of chopping switch circuits using a chopping control signal. The offset elimination using the chopping method causes a minute deviation during an averaging process, but the offset elimination may also be performed at points where current flows.

An input signal Vin input to the third offset elimination circuit 600 may be electrically connected to a first chopping switch circuit 620 and a second chopping switch circuit 630 through a first node, and an output signal Vout output from the third offset elimination circuit 600 may be electrically connected to a third chopping switch circuit 640 and a fourth chopping switch circuit 650 through a second node.

One terminal of the first chopping switch circuit 620 may be electrically connected to an input terminal of the third sub-operational amplifier 610.

One terminal of the second chopping switch circuit 630 may be electrically connected to the input terminal of the third sub-operational amplifier 610.

One terminal of the third chopping switch circuit 640 may be electrically connected to an output terminal of the third operational amplifier.

The fourth chopping switch circuit 650 may be electrically connected to the output terminal of the third operational amplifier circuit.

The first chopping switch circuit 620 and the second chopping switch circuit 630 may form the first node as a common node, and the third chopping switch circuit 640 and the fourth chopping switch circuit 650 may form the second node as a common node.

Figure 12:
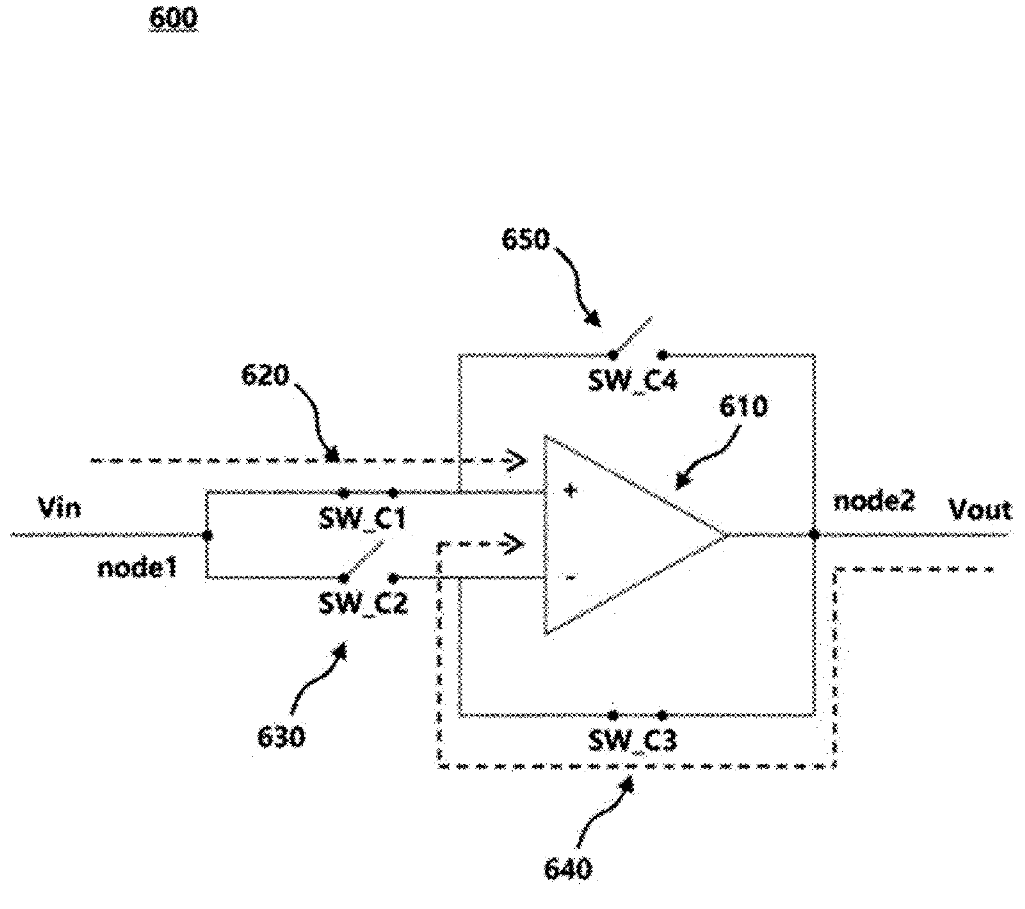
FIG. 12 is a diagram illustrating a turn-on operation of a first chopping switch circuit and a third chopping switch circuit of the third offset elimination circuit according to an embodiment of the present disclosure.

FIG. 12 is a diagram illustrating a turn-on operation of the first chopping switch circuit and the third chopping switch circuit of the third offset elimination circuit according to an embodiment of the present disclosure.

Figure 13:
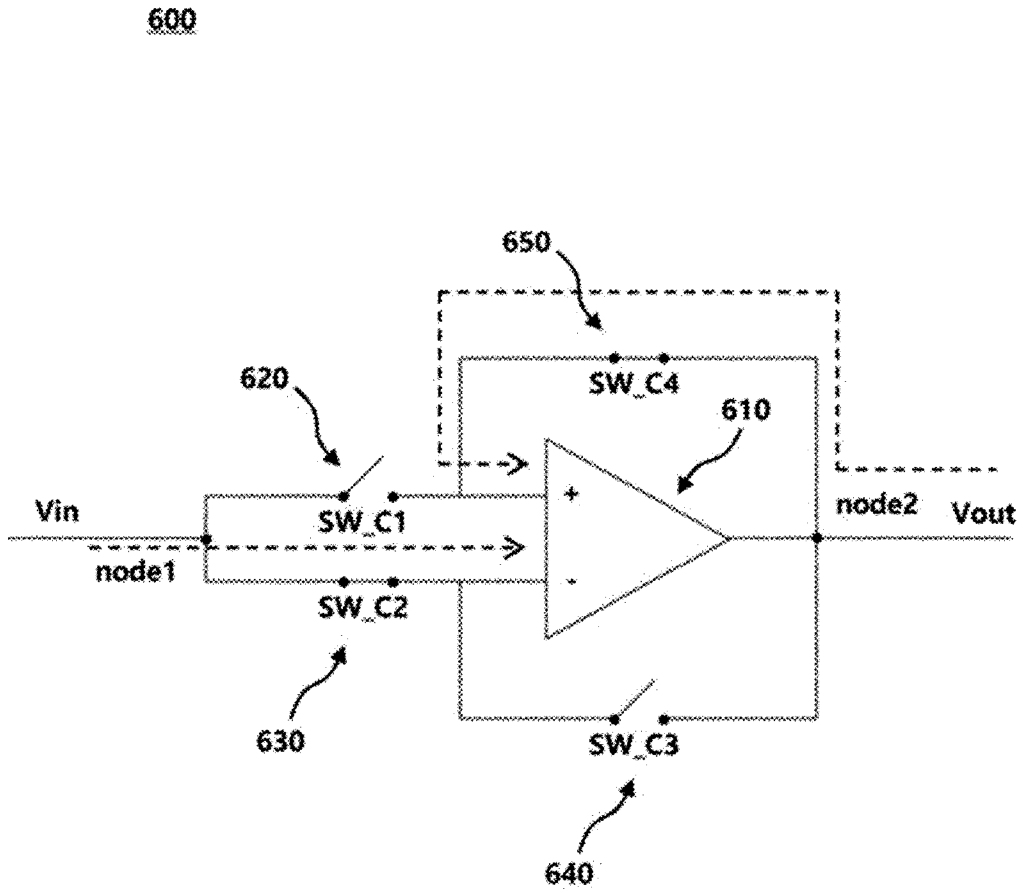
FIG. 13 is a diagram illustrating a turn-on operation of a second chopping switch circuit and a fourth chopping switch circuit of the third offset elimination circuit according to an embodiment of the present disclosure.

FIG. 13 is a diagram illustrating a turn-on operation of the second chopping switch circuit and the fourth chopping switch circuit of the third offset elimination circuit according to an embodiment of the present disclosure.

Referring to FIGS. 12 and 13, in the third offset elimination circuit 600, the first chopping switch circuit and the third chopping switch circuit may form one group, and the second chopping switch circuit and the fourth chopping switch circuit may form another group.

The first chopping switch circuit 620 and the third chopping switch circuit 640 may be turned on and off at the same timing, and the second chopping switch circuit 630 and the fourth chopping switch circuit 650 may be turned on and off at the same timing. Switching operations of each group may be performed alternately.

An operation of the second chopping switch circuit 630 and the fourth chopping switch circuit 650 may perform at a timing opposite to an operation timing of the first chopping switch circuit 620 and the third chopping switch circuit 640.

As the third offset elimination circuit 600 performs the offset elimination using the chopping method, an offset voltage elimination operation may be performed on an uppermost operational amplifier circuit and a lowermost operational amplifier circuit.

When the same type of offset elimination circuit is used in all gamma voltage generation circuits, the auto zeroing method as shown in FIGS. 7 and 9 may not perform the offset elimination at an uppermost end and a lowest end, and the chopping method as shown in FIGS. 11 to 13 causes a minute deviation during an averaging process.

In the gamma voltage generation circuit, the first and second offset elimination circuits as shown in FIGS. 7 and 9 are disposed at a center of the resistor string to perform the offset elimination operation of the auto-zeroing method, and the third offset elimination circuit as shown in FIGS. 11 to 13 is disposed in the uppermost operational amplifier circuit and the lowermost operational amplifier circuit to perform the offset elimination operation of the chopping method, thereby effectively suppressing a current change using a mixed driving method.

What is claimed is:

1. A gamma voltage generation circuit comprising:

a resistor string;

a first operational amplifier circuit connected to an uppermost end of the resistor string and configured to output a first voltage corresponding to a highest voltage of the resistor string;

a second operational amplifier circuit connected to a lowest end of the resistor string and configured to output a second voltage corresponding to a lowest voltage of the resistor string; and a third operational amplifier circuit connected to a node of the resistor string and configured to divide the first voltage and the second voltage and to output a third voltage, wherein the third operational amplifier circuit includes a first offset elimination circuit configured to eliminate an offset voltage through charging and discharging of a capacitor by an Auto-Zeroing method, the Auto-Zeroing method including storing the offset voltage in the capacitor during a sampling interval and eliminating the offset voltage during a different interval based on the stored voltage, and the first operational amplifier circuit and the second operational amplifier circuit are configured to eliminate an offset voltage by a chopping method including periodically switching connections of input and output terminals, and wherein the Auto-Zeroing method is applied to the third operational amplifier circuit connected to the node of the resistor string, and the chopping method is applied to the first operational amplifier circuit and the second operational amplifier circuit connected to opposite ends of the resistor string, such that different offset elimination methods are selectively applied according to positions of the operational amplifier circuits.

2. The gamma voltage generation circuit of claim 1, wherein the first offset elimination circuit is configured to perform a sampling operation in a first time interval to charge an offset voltage of a first sub-operational amplifier circuit to a first capacitor and perform an offset elimination operation in a second time interval to eliminate the offset voltage of the first sub-operational amplifier circuit based on a voltage stored in the first capacitor.

3. The gamma voltage generation circuit of claim 1, wherein the first offset elimination circuit includes:

a first sub-operational amplifier;

a first switch electrically connected to a first input terminal of the first sub-operational amplifier;

a first capacitor electrically connected to a second input terminal of the first sub-operational amplifier and configured to store an offset voltage of the first sub-operational amplifier;

a second switch electrically connected to the second input terminal and an output terminal of the first sub-operational amplifier and forming a common node with the first capacitor;

a third switch electrically connected to the first switch and the first capacitor and forming a common node with the first switch and the first capacitor; and a fourth switch electrically connected to the output terminal of the first sub-operational amplifier.

4. The gamma voltage generation circuit of claim 3, wherein, in the first offset elimination circuit, the first switch and the second switch are turned on and the third switch and the fourth switch are turned off in a first time interval to store the offset voltage of the first sub-operational amplifier in the first capacitor, and the first switch and the second switch are turned off and the third switch and the fourth switch are turned on in a second time interval to eliminate the offset voltage of the first sub-operational amplifier.

5. The gamma voltage generation circuit of claim 4, wherein the third operational amplifier circuit further includes a second offset elimination circuit configured to eliminate an offset voltage through charging and discharging a capacitor, and the second offset elimination circuit is configured to perform an offset elimination operation in the first time interval to eliminate an offset voltage of a second sub-operational amplifier circuit based on a voltage stored in a second capacitor and perform a sampling operation in the second time interval to charge the offset voltage of the second sub-operational amplifier circuit to the second capacitor.

6. The gamma voltage generation circuit of claim 5, wherein the first offset elimination circuit and the second offset elimination circuit are connected in parallel, and an offset elimination operation of the first offset elimination circuit and an offset elimination operation of the second offset elimination circuit are performed alternately and repeatedly.

7. The gamma voltage generation circuit of claim 6, wherein the second offset elimination circuit has the same circuit structure as the first offset elimination circuit and is configured to share nodes of input/output terminals with the first offset elimination circuit to be connected in parallel.

8. The gamma voltage generation circuit of claim 1, wherein the first operational amplifier circuit and the second operational amplifier circuit include a third offset elimination circuit configured to perform an offset voltage elimination operation by a chopping method including periodically switching connections of input and output terminals, independently of an offset voltage elimination operation of the first offset elimination circuit.

9. The gamma voltage generation circuit of claim 8, wherein the third offset elimination circuit is configured to perform an offset elimination operation by the chopping method including a first chopping switch circuit, a second chopping switch circuit, a third chopping switch circuit and a fourth chopping switch circuit that are turned on and off alternately, the first chopping switch circuit is electrically connected to an input terminal of a third sub-operational amplifier, the second chopping switch circuit is electrically connected to the input terminal of the third sub-operational amplifier, the third chopping switch circuit is electrically connected to an output terminal of the third sub-operational amplifier, the fourth chopping switch circuit is electrically connected to the output terminal of the third sub-operational amplifier, the first chopping switch circuit and the second chopping switch circuit form a common node, and the third chopping switch circuit and the fourth chopping switch circuit form a common node.

10. The gamma voltage generation circuit of claim 9, wherein the first chopping switch circuit and the third chopping switch circuit are configured to be turned on and turned off at the same timing, and the second chopping switch circuit and the fourth chopping switch circuit are configured to be turned on and turned off at the same timing and are configured to perform an operation at a timing opposite to an operation timing of the first chopping switch circuit and the third chopping switch circuit.

11. A data driving circuit comprising:

a data voltage generation circuit configured to supply a data voltage to a pixel through a data line; and a gamma reference voltage generation circuit configured to distribute a power supply voltage formed at both ends of a resistor string to generate a gamma reference voltage and supply the gamma reference voltage to the pixel through the data line, wherein the gamma reference voltage generation circuit includes:

the resistor string;

a first operational amplifier circuit connected to a first end of the resistor string;

a second operational amplifier circuit connected to a second end of the resistor string; and a third operational amplifier circuit connected to a node of the resistor string, wherein the third operational amplifier circuit includes a first offset elimination circuit configured to eliminate an offset voltage through charging and discharging of a capacitor by an Auto-Zeroing method, the Auto-Zeroing method including storing the offset voltage in the capacitor during a sampling interval and eliminating the offset voltage during a different interval based on the stored voltage, and the first operational amplifier circuit and the second operational amplifier circuit include a third offset elimination circuit configured to eliminate an offset voltage by a chopping method including periodically switching connections of input and output terminals, and wherein the Auto-Zeroing method is applied to the third operational amplifier circuit connected to the node of the resistor string, and the chopping method is applied to the first operational amplifier circuit and the second operational amplifier circuit connected to opposite ends of the resistor string, such that different offset elimination methods are selectively applied according to positions of the operational amplifier circuits.

12. The data driving circuit of claim 11, wherein the third operational amplifier circuit includes the first offset elimination circuit and a second offset elimination circuit connected in parallel, and the second offset elimination circuit is configured to repeatedly perform an offset elimination operation at a sampling operation timing of the first offset elimination circuit and the first offset elimination circuit is configured to perform an offset elimination operation at a sampling operation timing of the second offset elimination circuit.

13. The data driving circuit of claim 12, wherein the first offset elimination circuit and the second offset elimination circuit have the same structure and are configured to be controlled such that turn-on and turn-off timings of internal switches of the first offset elimination circuit and the second offset elimination circuit are opposite to each other.

14. The data driving circuit of claim 13, wherein the first offset elimination circuit includes:

a first sub-operational amplifier;

a first switch electrically connected to a first input terminal of the first sub-operational amplifier;

a first capacitor electrically connected to a second input terminal of the first sub-operational amplifier and configured to store an offset voltage of the first sub-operational amplifier;

a second switch electrically connected to the second input terminal and an output terminal of the first sub-operational amplifier and forming a common node with the first capacitor;

a third switch electrically connected to the first switch and the first capacitor and forming a common node; and a fourth switch electrically connected to the output terminal of the first sub-operational amplifier.

15. The data driving circuit of claim 12, wherein the first operational amplifier circuit and the second operational amplifier circuit include the third offset elimination circuit that is configured to perform an offset voltage elimination operation independently of offset voltage elimination operations of the first offset elimination circuit and the second offset elimination circuit, and the third offset elimination circuit is configured to perform the offset voltage elimination operation by the chopping method including a first chopping switch circuit, a second chopping switch circuit, a third chopping switch circuit and a fourth chopping switch circuit that are turned on and off alternately.

16. The data driving circuit of claim 11, wherein, in the first operational amplifier circuit, an input terminal is connected to a first multiplexer supplied with a voltage, and an output signal supplied from an output terminal is not divided, and in the second operational amplifier circuit, an input terminal is connected to a second multiplexer supplied with a voltage, and an output signal supplied from an output terminal is not divided.

17. A method of eliminating an offset comprising:

eliminating an offset voltage of a first operational amplifier circuit connected to a first end of a first resistor string and outputting a first gamma reference voltage;

eliminating an offset voltage of a second operational amplifier circuit connected to a second end of the first resistor string and outputting a second gamma reference voltage;

eliminating an offset voltage of a third operational amplifier circuit connected to a node of the first resistor string and outputting a third gamma reference voltage; and selecting and supplying a voltage between a maximum reference voltage and a minimum reference voltage through a second resistor string, wherein eliminating the offset voltage of the third operational amplifier circuit includes performing an Auto-Zeroing method including storing the offset voltage in a capacitor during a sampling interval and eliminating the offset voltage during a different interval based on the stored voltage, and eliminating the offset voltage of the first operational amplifier circuit and the second operational amplifier circuit includes performing a chopping method including periodically switching connections of input and output terminals, and wherein the Auto-Zeroing method is performed for the third operational amplifier circuit connected to the node of the first resistor string, and the chopping method is performed for the first and second operational amplifier circuits connected to opposite ends of the first resistor string, such that different offset elimination methods are selectively applied according to positions of the operational amplifier circuits.

18. The method of eliminating an offset of claim 17, wherein the third operational amplifier circuit includes a first offset elimination circuit and a second offset elimination circuit, the first offset elimination circuit performs a sampling operation in a first time interval to charge an offset voltage of a first sub-operational amplifier circuit to a first capacitor and performs an offset elimination operation in a second time interval to eliminate the offset voltage of the first sub-operational amplifier circuit based on a voltage stored in the first capacitor, and the second offset elimination circuit performs an offset elimination operation in the first time interval to eliminate an offset voltage of a second sub-operational amplifier circuit based on a voltage stored in a second capacitor and performs a sampling operation in the second time interval to charge the offset voltage of the second sub-operational amplifier circuit to the second capacitor.

19. The method of eliminating an offset of claim 18, wherein the first offset elimination circuit and the second offset elimination circuit have the same structure, and the first offset elimination circuit includes:

a first sub-operational amplifier;

a first switch electrically connected to a first input terminal of the first sub-operational amplifier;

a first capacitor electrically connected to a second input terminal of the first sub-operational amplifier and storing an offset voltage of the first sub-operational amplifier;

a second switch electrically connected to the second input terminal and an output terminal of the first sub-operational amplifier and forming a common node with the first capacitor;

a third switch electrically connected to the first switch and the first capacitor and forming a common node; and a fourth switch electrically connected to the output terminal of the first sub-operational amplifier.

20. The method of eliminating an offset of claim 19, wherein a third offset elimination circuit of the first operational amplifier circuit and the second operational amplifier circuit performs an offset elimination operation by the chopping method including a first chopping switch circuit, a second chopping switch circuit, a third chopping switch circuit and a fourth chopping switch circuit that are turned on and off alternately, the first chopping switch circuit is electrically connected to an input terminal of a third sub-operational amplifier, the second chopping switch circuit is electrically connected to the input terminal of the third sub-operational amplifier, the third chopping switch circuit is electrically connected to an output terminal of the third sub-operational amplifier, the fourth chopping switch circuit is electrically connected to the output terminal of the third sub-operational amplifier, the first chopping switch circuit and the second chopping switch circuit form a common node, and the third chopping switch circuit and the fourth chopping switch circuit form a common node.

* * * * *